United States Patent
Lai

(10) Patent No.: US 9,030,650 B2
(45) Date of Patent: May 12, 2015

(54) LASER RANGEFINDER

(75) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 796 days.

(21) Appl. No.: 13/176,757

(22) Filed: Jul. 6, 2011

(65) Prior Publication Data

US 2012/0274921 A1 Nov. 1, 2012

(30) Foreign Application Priority Data

Apr. 28, 2011 (TW) .............................. 100114758 A

(51) Int. Cl.
*G01C 3/08* (2006.01)
*B81B 7/04* (2006.01)
*G01S 7/48* (2006.01)
*G01S 17/42* (2006.01)
*G01S 7/481* (2006.01)

(52) U.S. Cl.
CPC .............. *G01C 3/08* (2013.01); *B81B 2207/053* (2013.01); *B81B 2203/0154* (2013.01); *B81B 2201/047* (2013.01); *B81B 2201/0292* (2013.01); *B81B 7/04* (2013.01); *G01S 17/42* (2013.01); *G01S 7/4814* (2013.01); *G01S 7/4817* (2013.01)

(58) Field of Classification Search
CPC ................... B81B 2201/047; B81B 2207/053; B81B 7/04; B81B 7/02; G01S 7/484; G01S 7/4814; G02B 26/0833; G02B 26/0841; G02B 26/085; G02B 26/0858
See application file for complete search history.

(56) References Cited

U.S. PATENT DOCUMENTS

| | | | | |
|---|---|---|---|---|
| 3,904,274 A | * | 9/1975 | Feinleib et al. | 359/295 |
| 3,967,899 A | * | 7/1976 | O'Meara | 250/201.9 |
| 4,146,307 A | * | 3/1979 | Gaffard | 359/224.1 |
| 4,699,508 A | * | 10/1987 | Bolkow et al. | 356/5.07 |
| 5,096,279 A | * | 3/1992 | Hornbeck et al. | 359/230 |
| 5,455,669 A | * | 10/1995 | Wetteborn | 356/5.01 |
| 5,515,156 A | * | 5/1996 | Yoshida et al. | 356/5.01 |
| 5,526,172 A | * | 6/1996 | Kanack | 359/291 |
| 6,437,902 B2 | * | 8/2002 | Daneman et al. | 359/290 |
| 6,556,766 B2 | * | 4/2003 | Cheung et al. | 385/140 |
| 6,703,203 B2 | * | 3/2004 | Shao et al. | 435/6.19 |
| 6,989,921 B2 | * | 1/2006 | Bernstein et al. | 359/290 |
| 7,064,810 B2 | * | 6/2006 | Anderson et al. | 356/5.01 |
| 7,206,063 B2 | * | 4/2007 | Anderson et al. | 356/5.01 |
| 7,236,256 B2 | * | 6/2007 | Yamaguchi | 356/603 |
| 7,317,281 B2 | * | 1/2008 | Hayashi et al. | 313/512 |
| 7,446,861 B2 | * | 11/2008 | Ouchi | 356/5.01 |
| 7,489,865 B2 | * | 2/2009 | Varshneya et al. | 398/33 |
| 7,532,311 B2 | * | 5/2009 | Henderson et al. | 356/4.01 |
| 7,676,125 B2 | * | 3/2010 | Zheng et al. | 385/18 |

(Continued)

*Primary Examiner* — Ari M Diacou
(74) *Attorney, Agent, or Firm* — Novak Druce Connolly Bove + Quigg LLP

(57) ABSTRACT

A laser rangefinder includes a laser emitter for emitting parallel laser beams, a micro electro mechanical system reflector including a plurality of micro reflecting units and configured for reflecting the parallel laser beams toward different points on an object, a micro electro mechanical system photoreceiver configured for receiving the laser beams reflected by and from the different points on the object, a time interval counter configured for recording the time intervals between a first time when the laser emitter emitting the parallel laser beams and second times when the laser beams are received by the micro electro mechanical system photoreceiver, and a processor configured for calculating the distances to the different points of the object based on the time intervals.

7 Claims, 3 Drawing Sheets

(56) References Cited

U.S. PATENT DOCUMENTS

| | | | |
|---|---|---|---|
| 7,720,388 B2* | 5/2010 | Varshneya et al. | 398/137 |
| 7,787,131 B1* | 8/2010 | Moran | 356/520 |
| 7,916,898 B2* | 3/2011 | Anderson | 382/104 |
| 7,945,129 B2* | 5/2011 | Yang et al. | 385/18 |
| 8,107,056 B1* | 1/2012 | Riza | 356/4.05 |
| 8,130,367 B2* | 3/2012 | Stettner et al. | 356/5.01 |
| 8,279,415 B2* | 10/2012 | Welland et al. | 356/5.01 |
| 8,531,650 B2* | 9/2013 | Feldkhun et al. | 356/4.01 |
| 8,629,353 B2* | 1/2014 | Dinyari et al. | 174/254 |
| 2001/0034077 A1* | 10/2001 | Wine et al. | 438/52 |
| 2002/0070639 A1* | 6/2002 | Yamaguchi et al. | 310/330 |
| 2002/0071166 A1* | 6/2002 | Jin et al. | 359/224 |
| 2002/0110164 A1* | 8/2002 | Vetrovec | 372/36 |
| 2002/0139920 A1* | 10/2002 | Seibel et al. | 250/208.1 |
| 2002/0197009 A1* | 12/2002 | Cheung et al. | 385/31 |
| 2003/0043363 A1* | 3/2003 | Jamieson et al. | 356/5.01 |
| 2003/0174314 A1* | 9/2003 | Riza | 356/121 |
| 2004/0042287 A1* | 3/2004 | Okumura | 365/200 |
| 2005/0057741 A1* | 3/2005 | Anderson et al. | 356/5.01 |
| 2005/0088643 A1* | 4/2005 | Anderson | 356/5.01 |
| 2006/0152105 A1* | 7/2006 | Aksyuk et al. | 310/307 |
| 2006/0176468 A1* | 8/2006 | Anderson et al. | 356/5.01 |
| 2006/0227317 A1* | 10/2006 | Henderson et al. | 356/28 |
| 2008/0231832 A1* | 9/2008 | Sawachi | 356/5.1 |
| 2008/0309913 A1* | 12/2008 | Fallon | 356/4.01 |
| 2009/0010644 A1* | 1/2009 | Varshneya et al. | 398/33 |
| 2009/0059201 A1* | 3/2009 | Willner et al. | 356/5.01 |
| 2009/0115994 A1* | 5/2009 | Stettner et al. | 356/5.01 |
| 2009/0142053 A1* | 6/2009 | Varshneya et al. | 398/33 |
| 2009/0245788 A1* | 10/2009 | Varshneya et al. | 398/33 |
| 2010/0008588 A1* | 1/2010 | Feldkhun et al. | 382/206 |
| 2011/0187810 A1* | 8/2011 | Owa et al. | 347/248 |
| 2012/0018898 A1* | 1/2012 | Ebefors et al. | 257/774 |
| 2012/0120375 A1* | 5/2012 | Kilcher et al. | 353/98 |
| 2013/0321791 A1* | 12/2013 | Feldkhun et al. | 356/4.01 |

* cited by examiner

LASER RANGEFINDER

BACKGROUND

1. Technical Field

The present disclosure relates to distance measurement technologies, and particularly, to a laser rangefinder.

2. Description of Related Art

A laser rangefinder is preferred for determining distance of an object. During the process of determining distance of the object, the object is treated as a point. If the object has a rough and uneven reflecting surface, the points on the reflecting surface have big distance differences, the object cannot be treated as a point. Therefore, the previous mentioned laser rangefinder cannot precisely measure the distance of the rough object.

Therefore, it is desirable to provide a laser rangefinder, which can overcome or at least alleviate the limitations described.

DETAILED DESCRIPTION

Figure 1:
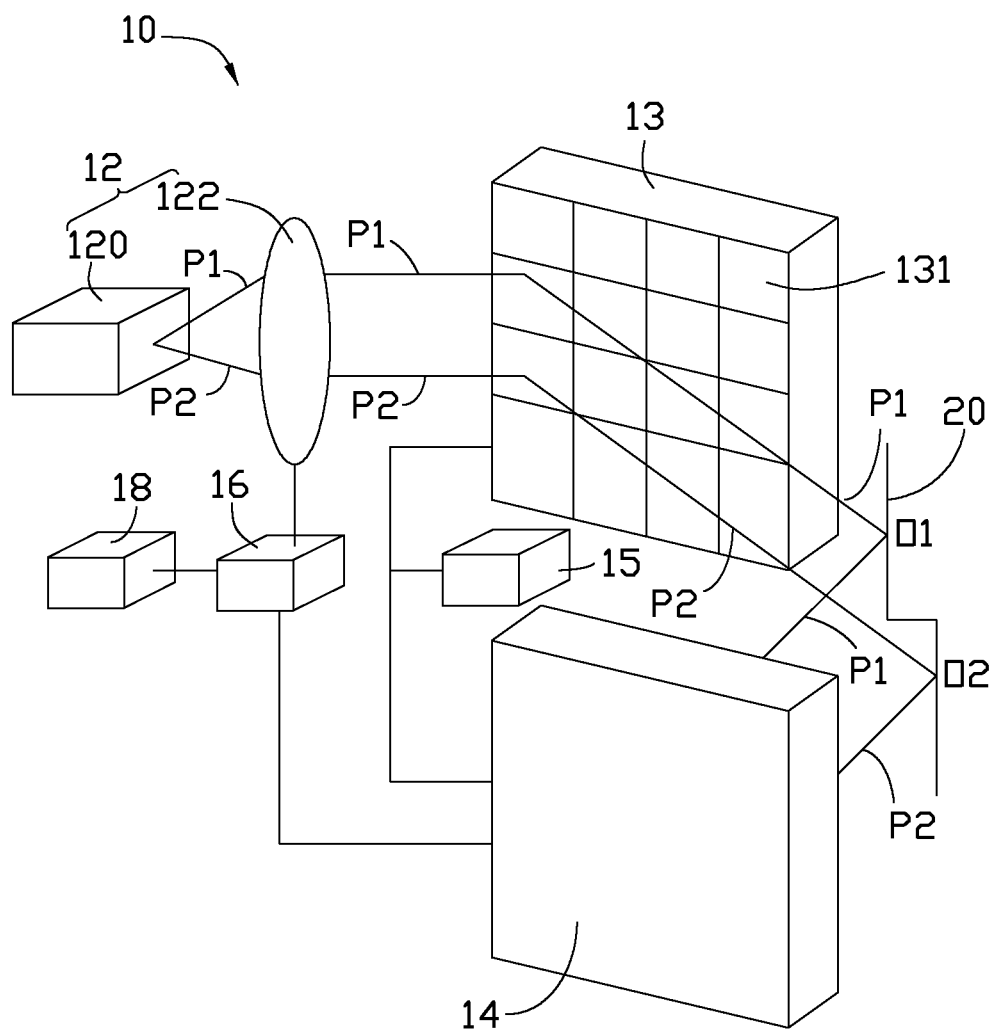
FIG. 1 is an isometric, schematic view of a laser rangefinder including a micro electro mechanical system (MEMS) reflector and a MEMS photoreceiver, according to an exemplary embodiment.

Referring to FIG. 1, a laser rangefinder 10, according to an exemplary embodiment, includes a laser emitter 12, a MEMS reflector 13, a MEMS photoreceiver 14, a controller 15, a time interval counter 16, and a processor 18.

The laser emitter 12 includes a laser diode 120 and a condensing lens 122. The laser diode 120 is configured for emitting laser beams toward the condensing lens 122. The condensing lens 122 is positioned between the laser emitter 120 and the MEMS reflector 13. The condensing lens 12 is configured for parallelizing the light beams from the laser emitter 120 to form parallel light beams.

Figure 2:
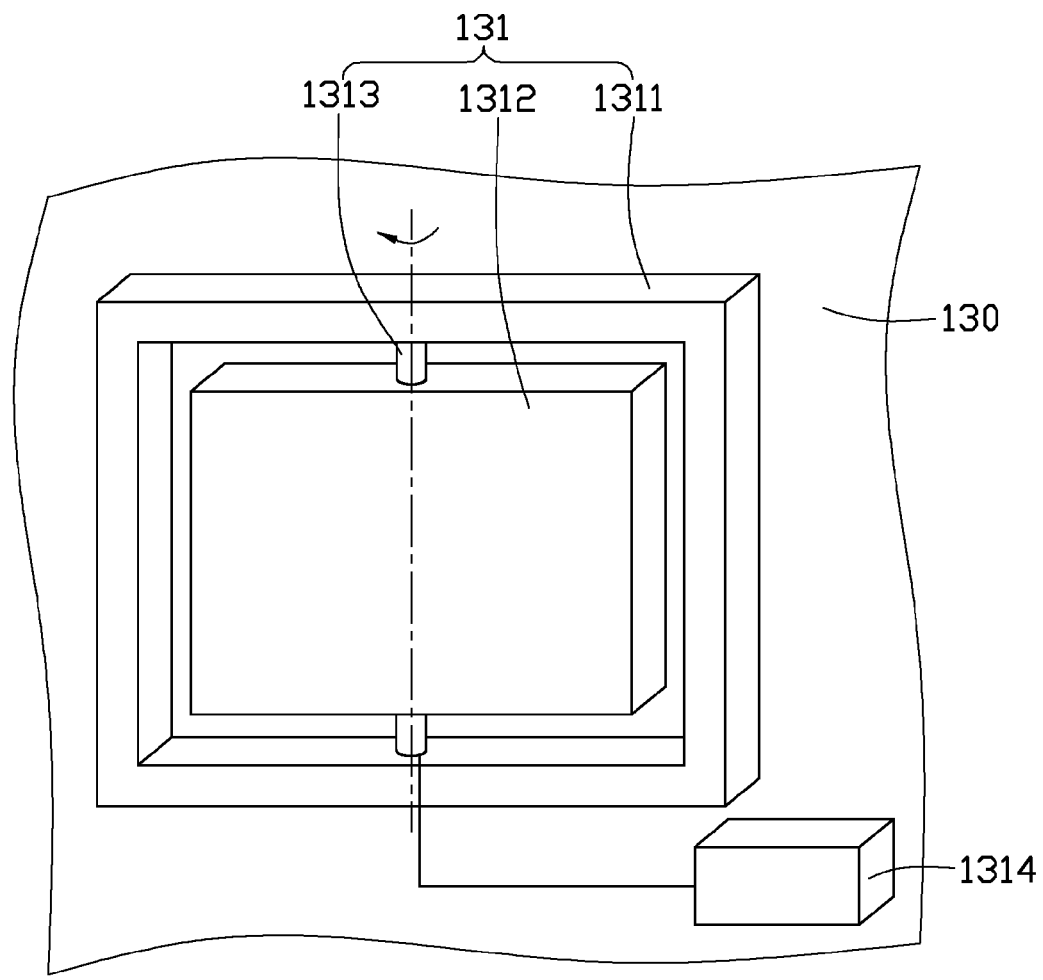
FIG. 2 is an isometric, schematic view of a reflecting unit of the MEMS reflector of FIG. 1.

Referring to FIGS. 1-2, the MEMS reflector 13 is configured for reflecting the parallel laser beams toward different points on an object 20. The MEMS reflector 13 includes a base 130 and sixteen micro reflecting units 131. The sixteen reflecting units 131 are arranged in a 4×4 array on the base 130. Each reflecting unit 131 includes a first frame 1311, a reflecting mirror 1312, a first shaft 1313 and a first driver 1314. The first frame 1311 is mounted on the base 130. A first spacer (not shown) is defined between the base 130 and the first frame 1311. That is, the first frame 1311 is apart from the base 130. The first driver 1314 is mounted on the base 130 and is electrically and mechanically connected to the first shaft 1313. The first driver 1314 is configured for driving the corresponding first shaft 1313 to rotate. The reflecting mirror 1312 is mounted in the first frame 1311 via the first shaft 1313 and is rotatable with the rotation of the first shaft 1313. A metallic layer with high reflectivity, such as an aluminium layer or a silver layer, is formed on the reflecting mirror 1312. The sixteen reflecting mirrors 1312 can rotate at the same angle or at different angles. In other embodiments, the MEMS reflector 13 may include thirty-six reflecting units 131, the thirty-six reflecting units 131 are arranged in a 6×6 array on the base 130.

Figure 3:
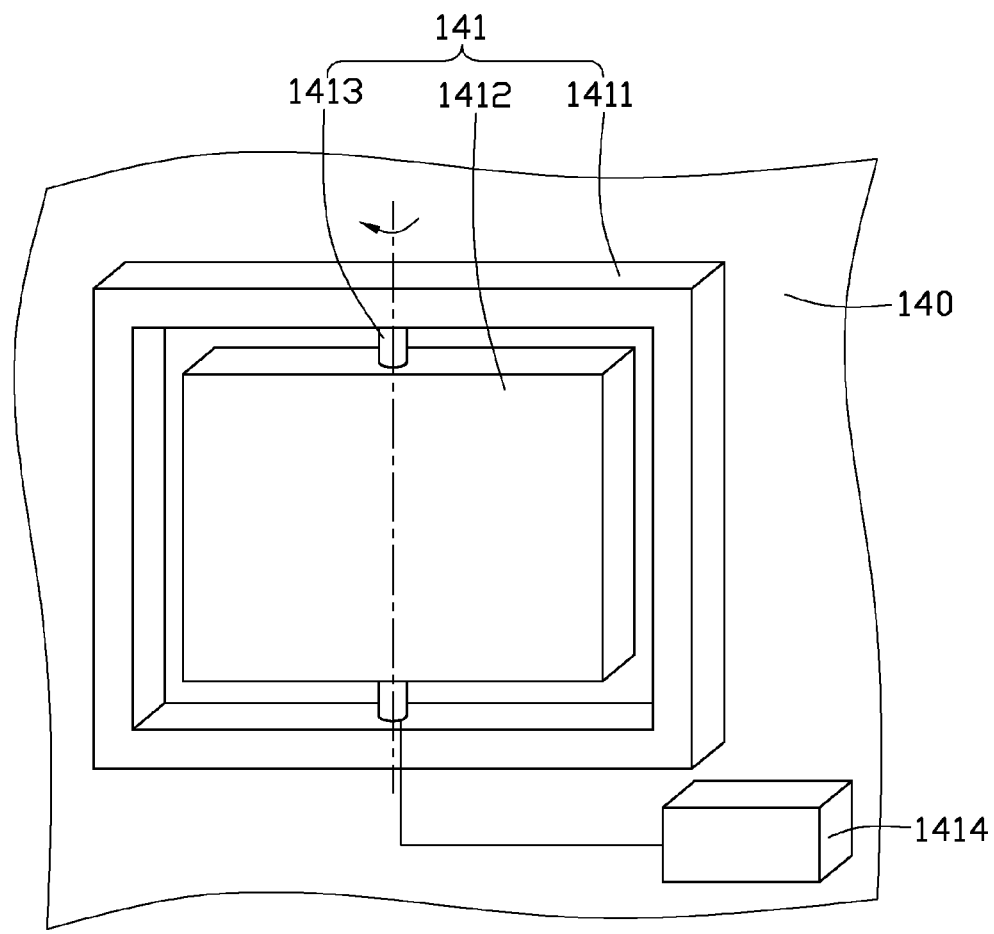
FIG. 3 is an isometric, schematic view of a receiving unit of the MEMS photoreceiver of FIG. 1.

Referring to FIGS. 1 and 3, the MEMS photoreceiver 14 is configured for receiving the laser beams reflected by and from the different points on the object 20. The MEMS photoreceiver 14 includes a substrate 140 and sixteen micro receiving units 141. The sixteen receiving units 141 correspond to the sixteen reflecting units 131 and are arranged in a 4×4 array on the substrate 140. Each receiving unit 141 includes a second frame 1411, a receiver 1412, a second shaft 1413, and a second driver 1414. The second frame 1411 is mounted on the substrate 140. A second spacer (not shown) is defined between the substrate 140 and the second frame 1411. That is, the second frame 1411 is apart from the substrate 140. The second driver 1414 is mounted on the substrate 140 and is electrically and mechanically connected to the second shaft 1413. The second driver 1414 is configured for driving the corresponding second shaft 1413 to rotate. The receiver 1412 is mounted in the second frame 1411 via the second shaft 1413 and is rotatable with the rotation of the second shaft 1413. The sixteen receivers 1412 can rotate at the same angle or at different angles. When the MEMS reflector 13 includes thirty-six reflecting units 131, the MEMS photoreceiver 14 includes thirty-six receiving units 141 and the thirty-six receiving units 141 are arranged in a 6×6 array on the substrate 140.

The controller 15 is electrically connected to the first drivers 1314 and the second drivers 1414. The controller 15 is configured for controlling the first drivers 1314 and the second drivers 1414 to rotate the respective first shafts 1313 and the respective second shafts 1413.

The time interval counter 16 is electrically connected to the laser emitter 12 and the MEMS photoreceiver 14. The time interval counter 16 is configured for recording the time intervals between a first time when the laser emitter 12 emits the parallel laser beams and second times when the light beams are received by the corresponding receiving units 141.

The processor 18 is electrically connected to the time interval counter 16. The processor 18 is configured for calculating the distances from the laser rangefinder 10 to the different points on the object 20 based on the time intervals and the speed of laser beam.

When the laser rangefinder 10 is working, the laser diode 120 emits laser beams. The light beams include a laser beam P1 and a laser beam P2 for example. The laser beam P1 and the laser beam P2 are parallelized by the condensing lens 122 into two parallel light beams. The laser beam P1 impinges on a first reflecting mirror 1312 and is reflected toward a first point O1 on the object 20. The laser beam P2 impinges on a second reflecting mirror 1312 and is reflected toward a second point O2 on the object 20. The laser beam P1 is reflected by the object 20 and impinges on a first receiver 1412. The laser beam P2 is reflected by the object 20 and impinges on a second receiver 1412. The time interval counter 16 records a first time interval $\Delta t1$ between a first time when the laser emitter 12 emits the parallel laser beams P1 and a second time when the laser beam P1 is received by the first receiver 1412. The time interval counter 16 also records a second time interval $\Delta t2$ between a first time when the laser emitter 12 emits the parallel laser beams P2 and a second time when the laser beam P2 is received by the second receiver 1412. The processor 18 calculates a first distance from the laser rangefinder 10 to the first point O1 on the object 20 and a second distance from the laser rangefinder 10 to the second point O2 on the object 20 according to the following formula: $\Delta t1 = 2L1/C$, $\Delta t2 = 2L2/C$, wherein $\Delta t1$ is the first time interval between a first time when the laser emitter 12 emits the parallel laser beams P1 and a second time when the laser beam P1 is received by the first receiver 1412, L1 is the distance from the laser rangefinder 10 to the first point O1 on the object 20, Δt2 is the second interval time between a first time when the laser emitter 12 emits the parallel laser beams P2 and a second time when the laser beam P2 is received by the second receiver 1412, L2 is the distance from the laser rangefinder 10 to the second point O2 of the object 20, and C is the speed of laser beam. Therefore, the laser rangefinder 10 can measure the distance to a rough object.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of the shape, size, and arrangement of parts within the principles of the disclosure to the full extent indicated by the broad general meaning of the terms in which the appended claims are expressed.

What is claimed is:

1. A laser rangefinder, comprising:
   a laser emitter for emitting parallel laser beams;
   a micro electro mechanical system reflector including a plurality of micro reflecting units configured for reflecting the parallel laser beams toward different points on an object;
   a micro electro mechanical system photoreceiver configured for receiving the laser beams reflected by and from the different points on the object, the micro electro mechanical system photoreceiver comprising a substrate, and a plurality of the receiving units arranged in an array and positioned on the substrate, corresponding to the reflecting units;
   a time interval counter configured for recording time intervals between a first time when the laser emitter emitting the parallel laser beams and second times when the laser beams are received by the micro electro mechanical system photoreceiver;
   a processor configured for calculating the distances to the different points of the object based on the time intervals.

2. The laser rangefinder as claimed in claim 1, wherein the micro electro mechanical system reflector comprises a base and the reflecting units arranged in an array on the base.

3. The laser rangefinder as claimed in claim 2, wherein each reflecting unit comprises a frame, a reflecting mirror, a shaft, and a driver, the frame is mounted on the base and apart from the base, the driver is fixed on the base and configured to drive the shaft to rotate, and the reflecting mirror is mounted in the frame via the shaft and is rotatable with the rotation of the shaft.

4. The laser rangefinder as claimed in claim 3, wherein a metallic layer with high reflectivity is formed on each reflecting mirror.

5. The laser rangefinder as claimed in claim 4, wherein the metallic layer comprises an aluminium layer or a silver layer.

6. The laser rangefinder as claimed in claim 1, wherein each receiving unit comprises a frame, a receiver, a shaft, and a driver, the frame is mounted on the substrate and apart from the substrate, the driver is fixed on the substrate and configured to drive the shaft to rotate, and the receiver is mounted in the frame via the shaft and is rotatable with the rotation of the shaft.

7. The laser rangefinder as claimed in claim 1, wherein the laser emitter comprises a laser diode and a condensing lens, the laser diode is configured for emitting laser beams toward the condensing lens, and the condensing lens is configured for parallelizing the light beams from the laser emitter to form parallel light beams.

\* \* \* \* \*